(12) United States Patent
Lesso et al.

(10) Patent No.: US 10,649,732 B2
(45) Date of Patent: May 12, 2020

(54) PROCESSING CIRCUITRY

(71) Applicant: Cirrus Logic International Semiconductor Ltd., Edinburgh (GB)

(72) Inventors: John Paul Lesso, Edinburgh (GB); Mark McCloy-Stevens, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 9 days.

(21) Appl. No.: 16/050,990

(22) Filed: Jul. 31, 2018

(65) Prior Publication Data

US 2020/0042288 A1   Feb. 6, 2020

(51) Int. Cl.
   *G06F 7/533*   (2006.01)
   *H03K 19/17704*   (2020.01)

(52) U.S. Cl.
   CPC ....... *G06F 7/5338* (2013.01); *H03K 19/1772* (2013.01)

(58) Field of Classification Search
   CPC ............ G06F 7/62; G06G 7/161; H03M 3/30; H03M 3/39; H03M 3/326; H03M 7/3004; H03K 7/08; H03K 3/02337
   (Continued)

(56) References Cited

U.S. PATENT DOCUMENTS 3,780,273 A * 12/1973 Turrell ...................... G06J 1/00
                                                           708/7
4,920,312 A    4/1990 Maruyama
(Continued)

FOREIGN PATENT DOCUMENTS

GB     790578 A  *  2/1958  ............. G06G 7/161
GB     790578 A      2/1958

OTHER PUBLICATIONS

R. Moghimi, Curing Comparator Instability with Hysteresis, AnalogDialogue, vol. 34, 2000 (Year: 2000).*

(Continued)

*Primary Examiner* — Andrew Caldwell
*Assistant Examiner* — Emily E Larocque
(74) *Attorney, Agent, or Firm* — Jackson Walker L.L.P.

(57) ABSTRACT

This application relates to apparatus and methods for the multiplication of signals. A multiplication circuit (100) has first and second time-encoding modulators (103a, 103b) configured to receive first and second combined signals ($S_{C1}$, $S_{C2}$) respectively, and generate respective first and second PWM signals ($S_{PWM1}$, $S_{PWM2}$), each with a cycle frequency that depends substantially on the square of the value of the input combined signal. The first combined signal ($S_{C1}$) corresponds to a sum of a first and second input signals ($S_1$, $S_2$) and the second combined signal ($S_{C2}$) corresponds to the difference between the first and second input signals ($S_1$, $S_2$). First and second time-decoding converters (104a, 104b) receive the first and second PWM signals and provide respective first and count values ($D_1$, $D_2$) based on a parameter related to the frequency of the respective first or second PWM signal. A subtractor (105) determine a difference between the first and second count values ($D_1$, $D_2$) and provides an output signal ($D_{OUT}$) based on this difference.

18 Claims, 4 Drawing Sheets

(58) Field of Classification Search
USPC .................................................. 708/7, 103
See application file for complete search history.

(56) References Cited

U.S. PATENT DOCUMENTS

| | | | | |
|---|---|---|---|---|
| 7,996,452 B1 * | 8/2011 | Cruz-Albrecht | ....... | G06G 7/161 |
| | | | | 708/400 |
| 2014/0159929 A1 | 6/2014 | Zrilic | | |

OTHER PUBLICATIONS

J.R. Stockton, Proposed Quarter Squares Double Dual-Slope Digital Wattmeter, National Physical Laboratory, 1980 (Year: 1980).*
Combined Search and Examination Report under Sections 17 and 18(3), UKIPO, Application No. GB1813849.5, dated Feb. 11, 2019.
Examination Report under Section 18(3), UKIPO, Application No. GB1813849.5, dated Mar. 6, 2019.
International Search Report and Written Opinion of the International Searching Authority, International Application No. PCT/GB2019/052123, dated Oct. 30, 2019.
Kikkert, C.J. et al., "Asynchronous Delta Sigma Modulation", Institution of Radio and Electronics Engineers Australia, Proceedings, vol. 35, No. 4, Apr. 1975.

* cited by examiner

PROCESSING CIRCUITRY

TECHNICAL FIELD

This application relates to methods and apparatus for processing signals, and in particular to apparatus and methods for the multiplication of signals.

BACKGROUND

There are some signal processing applications where it may be desirable to multiply a first signal, which may be received as an input analogue signal, by a value represented by a second signal. For instance, in some audio applications for voice processing, it may be desirable to apply variable weightings to a number of input analogue signals derived from a microphone, prior to some downstream processing which may involve digital processing.

Analogue circuit techniques for multiplying analogue signals are known, for example using non-linearities in the electrical characteristics of active devices carefully biased to operate over an appropriate range. However, as analogue circuitry for multiplication may suffer from device mismatches, thermal drift, power supply noise and the like, and may require relatively complex arrangement to tune operation for a range of operating conditions and manufacturing tolerances, conventionally such multiplication may be implemented digitally. Thus the first signal, and if necessary the second signal, may be converted to digital signals and multiplication implemented as part of the digital processing.

Digital multiplication of two signals can be readily implemented. However, in general, digital processing can involve a relatively large number of circuit nodes potentially changing between high and low voltages each sample period, which inevitably involves a certain power consumption and heat generation.

In some applications, for example for battery powered devices, power consumption is a significant concern, especially for any processes that may be expected to be operational relatively frequently.

SUMMARY

Embodiments of the present disclosure thus provide processing circuitry that addresses at least some of the above mentioned issues.

Accordingly there is a provided a processing circuit comprising:
  a first time-encoding modulator configured to receive a first combined signal corresponding to a sum of a first input signal and a second input signal and to generate a first PWM signal with a cycle frequency that depends substantially on the square of the value of the first combined signal;
  a second time-encoding modulator configured to receive a second combined signal corresponding to a difference between said first input signal and said second input signal and to generate a second PWM signal with a cycle frequency that depends substantially on the square of the value of the second combined signal;
  a first time-decoding converter configured to receive the first PWM signal and to provide a first count value based on a first parameter of the first PWM signal;
  a second time-decoding converter configured to receive the second PWM signal and to provide a second count value based on a second parameter of the second PWM signal; and
  a subtractor configured to determine a difference between the first and second count values and to output an output signal based on said difference between the first and second count values.

In some implementations the first parameter may be a PWM cycle frequency of the first PWM signal and the second parameter may be a PWM cycle frequency of the second PWM signal. The first time-decoding converter and second time-decoding converter may each comprise a counter configured to receive a reference clock signal and count a number of PWM cycles in each of a succession of count periods defined by the reference clock signal to provide the count value.

In some implementations the first parameter may be a PWM cycle period of the first PWM signal and the second parameter may be a PWM cycle period of the second PWM signal. The first time-decoding converter and second time-decoding converter may each comprise a counter configured to receive a reference clock signal and to count a number of cycles of the reference clock signal in a PWM cycle period defined by the respective one of the first or second PWM signals to provide the count value. In some examples the processing circuit may be configured such the value of each of the first and second combined signals is limited to be no greater than a defined limit, such that a maximum variation in cycle frequency of the respective first or second PWM signals is no greater than 25%.

In some implementations the first and second time-decoding converters may each comprise a respective counter configured to receive a reference clock signal and the processing circuit may be selectively operable in a first mode or a second mode. In the first mode of operation, the first and second parameters may be the PWM cycle frequencies of the first and second PWM signals respectively, in which case the counters of the first and second time-decoding converters may each be configured to count a number of PWM cycles in each of a succession of count periods defined by the reference clock signal to provide the count value. In the second mode of operation, the first and second parameters may be PWM cycle periods of the first and second PWM signals respectively, and the counters of the first and second time-decoding converters may each be configured count a number of cycles of the reference clock signal in a PWM cycle period defined by the respective one of the first or second PWM signals to provide the count value. The frequency of the reference clock signal may be greater in the second mode than in the first mode.

In some examples each of the first time-encoding modulator and the second time-encoding modulator may comprises a forward signal path configured to receive the respective first or second combined signal at a first input and a feedback path forming a feedback loop with at least part of the forward signal path. A comparator may be located in the forward signal path within the feedback loop and there may also be a filter arrangement within the feedback loop. In some instances the comparator may be arranged to receive the relevant first or second combined signal at a first comparator input and a signal from the feedback path at a second comparator input. The filter arrangement may be configured to apply filtering in the feedback path. In some instances the input signal may be combined with a signal from the feedback path and supplied to a comparator input to be compared with a reference. In such a case the filter may be configured to apply filtering to the combined signal.

In some examples the comparator is a hysteretic comparator.

The filter arrangement may comprise a resistive-capacitive filter.

In some examples each of the first and second time-encoding modulators may comprises a current generator configured to receive the respective one of the first or second PWM signals output from the comparator and to generate a first controlled current signal having a first defined current during periods of a first voltage state of the PWM signal and a second controlled current signal during periods of a second voltage state of the PWM signal. A capacitor may be configured to be charged and discharged by the first controlled current signal.

The processing circuit may further comprise a signal combiner having a first combiner element, configured to additively combine the first input signal and the second input signal to generate the first combined signal, and a second combiner element, configured to subtractively combine the first input signal and the second input signal to generate the first combined signal. In some examples the first combiner element may comprise first and second current sources configured to provide currents defined by the first and second input signals respectively, wherein the first and second current sources are configured to supply current of the same polarity as one another to an output node of the first combiner element. The second combiner element may comprise third and fourth current sources configured to provide currents defined by the first and second input signals respectively, wherein the third and fourth current sources are configured to supply current of the opposite polarity as one another to an output node of the second combiner element.

The processing circuit may be implemented as an integrated circuit. Embodiments also relates to an electronic device comprising a processing circuit according to any of the variants discussed herein. The device may be at least one of: a battery powered device; a portable device; a communications device; a mobile telephone; a smartphone; a computing device; a laptop; notebook or tablet computer; a gaming device; a personal media player; a wearable device; a voice controlled device.

In another aspect there is provided a multiplication circuit for multiplying a first input value by a second input value comprising:
a first signal path configured to receive a first signal with a value corresponding to the sum of the first input value and second input value and to generate a first output value which is a function of the square of the value of the first signal;
a second signal path configured to receive a second signal with a value corresponding to the difference between the first input value and the second input value and to generate a second output value which is a function of the square of the value of the second signal; and
a subtractor for determining a difference between the first output value and second output value;
wherein each of the first and second signal paths comprises a self-oscillating time-encoding modulator and a time-decoding converter.

The multiplication circuit may further comprise a signal combiner configured to receive the first and second input values and generate the first and second signals.

In a further aspect there is provided a processing circuit comprising:
a signal combiner configured to receive first and second input signals and to generate a first combined signal corresponding to a sum of the first and second input signals and a second combined signal corresponding to a difference between the first and second input signals;
first and second time-encoding modulators configured to receive the first and second combined signals respectively and generate respective first and second cyclic signals with a cycle frequency, wherein the cycle frequency is substantially proportional to $(1-R^2)$ where R is a value of the respective input to the respective time-encoding modulator normalised within a range of −1 to +1 with respect to an input range of the time-encoding modulator; and
first and second counters configured to receive the first and second cyclic signals respectively and produce first and second count values; and
a subtractor configured to determine a difference between the first and second count values.

In some examples the first and second counters may each be configured to generate a count value of a number of cycle of the first or second cyclic signal in a count period defined by a reference clock signal.

Unless expressly indicated to the contrary, any of the various features of the various implementations discussed herein may be implemented together with any one or more of the other described features in any suitable combination.

BRIEF DESCRIPTION OF DRAWINGS

For a better understanding of examples of the present disclosure, and to show more clearly how the examples may be carried into effect, reference will now be made, by way of example only, to the following drawings in which.

DETAILED DESCRIPTION OF EMBODIMENTS

Embodiments relate to methods and apparatus for processing of signals, in particular to multiplying two signals together. Embodiments of the disclosure are suitable for multiplication of analogue signals and can provide a digital output.

Figure 1:
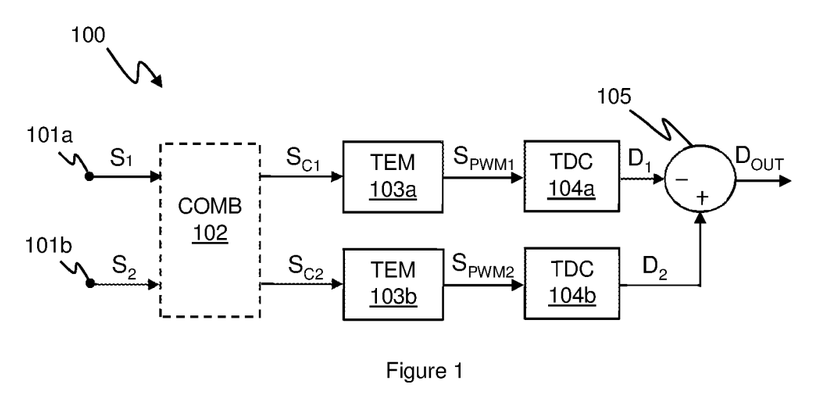
FIG. 1 illustrates one example of a processing circuit according to an embodiment.

FIG. 1 illustrates generally a processing circuit 100 for multiplication according to an embodiment. Processing circuit 100 receives first and second input signals $S_1$ and $S_2$ at inputs 101a and 101b, respectively. Signals $S_1$ and $S_2$ may be analogue signals, for instance analogue voltage signals where the voltage level of the signal can be seen as a value of the signal or analogue current signals where the magnitude of the current represents the magnitude of the signal value. In some embodiments the input signals $S_1$ and $S_2$ may represent the signal values it is wished to multiply, for instance the first signal $S_1$ may have a value X and the second signal $S_2$ may have a value Y and it may be wished to generate a value that corresponds to X multiplied by Y. In such a case the input signals $S_1$ and $S_2$ may be input to a signal combiner 102 which generates a first combined signal $S_{C1}$ corresponding to a sum of the first and second signals, i.e. $S_1+S_2$. The first combined signal $S_{C1}$ thus has a value corresponding to X+Y. The signal combiner 102 also generates a second combined signal $S_{C2}$ corresponding to a difference between the first and second signals, i.e. $S_1-S_2$. The second combined signal $S_{C2}$ thus has a value corresponding to X−Y. As will be described in more detail below, the combiner 102 can be implemented as analogue circuitry that provides the combined signals $S_{C1}$ and $S_{C2}$ as analogue signals, for instance if the input signals $S_1$ and $S_2$ are received as, or converted to, analogue current signals, the combiner 102 may additively combine the currents for combined signal $S_{C1}$ and subtractively combine the currents for combined signal $S_{C2}$.

The first and second combined signals $S_{C1}$ and $S_{C2}$ are input into respective time encoding modulators (TEMs) 103a and 103b (collectively or generically 103). The TEMs 103a and 103b each generate a respective time-encoded signal based on the respective combined signal $S_{C1}$ or $S_{C2}$ input to the TEM. In embodiments of the disclosure, each TEM 103 generates a repeating or cyclic pulse-width-modulated (PWM) signal, $S_{PWM1}$ or $S_{PWM2}$, where the PWM cycle frequency depends substantially on the square of the value of the input to the TEM, i.e. the first or second combined signal $S_{C1}$ or $S_{C2}$.

As will be described in more detail below, various different types of TEM may be implemented where the PWM duty-cycle and also the overall PWM cycle frequency vary in accordance with the value of the input to the TEM and where the cycle frequency depends substantially as the square of the value of the input to the TEM, for instance as:

$$F_{PWM}=F_0(1-R^2) \quad \text{(Eqn. 1)}$$

where $F_{PWM}$ is the cycle frequency of the PWM signal output from the TEM 103, $F_0$ is the PWM cycle frequency for an input of zero magnitude, i.e. the limit cycle frequency, and a R is the normalised value of the input within an input range, e.g. normalised by some appropriate value to have a value within the range −1 to +1, where −1 and +1 correspond to the lower and upper limits for the value of the input signal, i.e. the input signal level that would asymptotically lead to an output signal of zero frequency.

The PWM signals $S_{PWM1}$ and $S_{PWM2}$ are input to respective time-decoding converters (TDCs) 104a and 104b (collectively or generically 104), which produce a digital signal $D_1$ or $D_2$, with a value, for instance a count value, based on the period or the frequency of the respective PWM signals. The digital signals $D_1$ and $D_2$ from each TDC 104 are then subtracted from each other by subtractor 105 to produce a digital output signal $D_{OUT}$.

The digital output signal $D_{OUT}$ thus has a value based on the difference between the two count values $D_1$ and $D_2$:

$$D_{OUT}=D_2-D_1 \quad \text{(Eqn. 2)}$$

As noted above, the values $D_1$ and $D_2$ depend on the cycle frequency $F_{PWM}$ of the relevant PWM signal, $S_{PWM1}$ or $S_{PWM2}$. In instances where the count value produced by the TDC 104 is directly representative of the cycle frequency of the relevant PWM signal, then:

$$D_{OUT}=F_{PWM2}-F_{PWM1} \quad \text{(Eqn. 3)}$$

where $F_{PWM1}$ and $F_{PWM2}$ are the respective cycle frequencies of the first and second PWM signals. From equation 1 above it can be seen that the difference between the PWM cycle frequencies depends on the difference between the square of the value of the respective inputs to the TEMs 103a and 103b, i.e. the values of the first and second combined signals $S_{C1}$ and $S_{C2}$.

As discussed above the first combined signal $S_{C1}$ is arranged to have a value that corresponds to X+Y and the second combined signal $S_{C2}$ is arranged to have a value that corresponds to X−Y. Therefore:

$$D_{OUT}=D_2-D_1=F_0(1-(X-Y)^2)-F_0(1-(X+Y)^2)= \quad \text{(Eqn. 4)}$$
$$-F_0(X-Y)^2+F_0(X+Y)^2$$

so $$D_{OUT}=4F_0XY \quad \text{(Eqn. 5)}$$

thus it can be seen that the value of the digital output $D_{OUT}$ is related, in a known way, to the product of the values X and Y.

The processing circuit 100 can thus receive input signals $S_1$ and $S_2$, with values X and Y, and generate a digital value which corresponds to the product of X and Y. The input signals $S_1$ and $S_2$ may be analogue signals and thus the processing circuit 100 can be used for multiplication of analogue signals. The output value can be digital and multiplication of analogue signals can thus be achieved as part of a process of converting from analogue to digital, e.g. to allow further downstream processing. The arrangement of the two TEMs 103 with respective TDCs 104 can be implemented as a relatively small and low power circuit and thus embodiments of the present invention do not require complex analogue circuitry or a large number of logic gates for digital processing to implement multiplication.

Figure 2A:
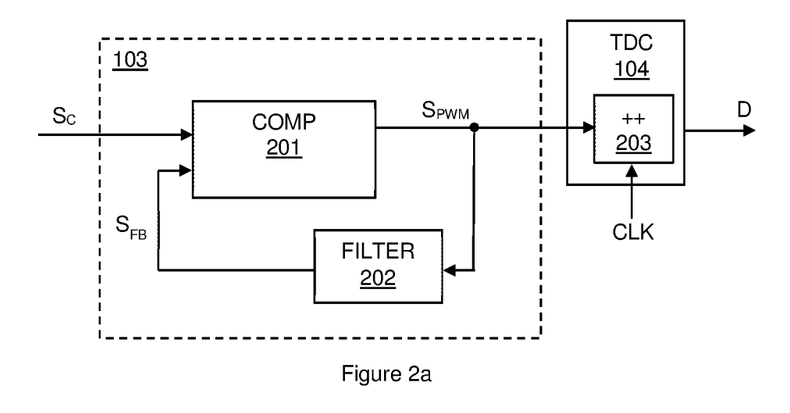
FIG. 2a illustrates one example of a time-encoding modulator and time-decoding converter suitable for use in a processing circuit according to an embodiment and FIG. 2b illustrates an example of a time-encoding modulator in more detail.

FIG. 2a illustrates one example of a suitable TEM 103 and also an example of a suitable TDC 104 that may be used for processing circuit 100. In this example TEM 103 comprises a comparator 201 arranged to receive an input analogue signal $S_{C1}$ for example the first or second combined signal $S_{C1}$ or $S_{C2}$. The input signal for the TEM $S_C$ is provided to a first comparator input of the comparator 201.

The comparator 201 compares the signal $S_C$ at the first comparator input with a signal received at a second comparator input and generates an output PWM signal $S_{PWM}$ based on the comparison. A feedback path also extends from an output of the comparator 201 to the second comparator input for providing a feedback signal $S_{FB}$ to the second comparator input. A filter arrangement 202 is arranged to apply filtering to the feedback path to provide the feedback signal $S_{FB}$. The TEM 103 is thus a self-oscillating TEM, as would be understood by one skilled in the art.

Figure 2B:
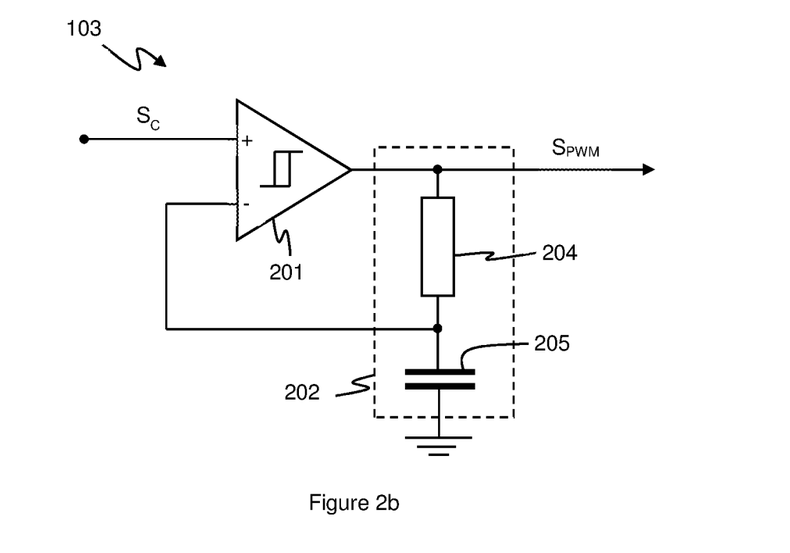

In some embodiments the comparator 201 may be a hysteretic comparator. FIG. 2b illustrates a hysteretic comparator based self-oscillating TEM 103 in more detail. In this example the comparator 201 is a hysteretic comparator and the filter arrangement comprises an RC type passive filter, with an impedance, in this case resistor 204, in series in the feedback path and a capacitance 205 coupled between a node of the feedback path and a defined voltage, e.g. ground. Whilst the filter arrangement 202 may be implemented using resistors and capacitors as illustrated, other RC components such as FET based resistances and/or capacitances may be used in some implementations.

The hysteretic comparator 201 compares the signals at the first and second comparator inputs, i.e. the signal $S_C$ and the feedback signal $S_{FB}$, and outputs either two output states, which may for instance be high and low voltage states $V_H$ or $V_L$, depending on the result of the comparison. The hysteretic comparator 201 is operable to apply hysteresis to the comparison such that a differential voltage between the signals $S_C$ and $S_{FB}$ at the first and second comparator inputs must be greater (i.e. more positive or less negative) than a first threshold to transition from one output state to the other, say from output state $V_L$ to the output state $V_H$, but must be lower (i.e. less positive or more negative) than a second, different threshold to make the opposite transition, e.g. to swap from the output state $V_H$ to the output state $V_L$. The difference between these first and second thresholds corresponds to the amount of hysteresis applied. In some implementations the first and second thresholds may be equal in magnitude and opposite in polarity, i.e. the difference between the signal $S_C$ and the feedback signal $S_{FB}$ must be greater than an amount +H to transition to one state, say $V_H$, and must be lower than −H to transition to the other state. In this instance the magnitude of H can be seen as a measure of the hysteresis applied by the hysteretic comparator 201.

In some embodiments the output states $V_H$ and $V_L$ may, for instance, be positive and negative voltages respectively and could, for example be voltages of equal magnitude but opposite polarity to one another, although states of unequal magnitude could be implemented. In some embodiments one of the output states may correspond to a zero voltage, i.e. ground, with the other output state corresponding to a voltage, whether positive or negative, of non-zero magnitude. In some instances the output states could be voltages of the same polarity but different non-zero magnitudes. The output states $V_H$ and $V_L$ may be derived from any suitable reference voltage or power supply, and may be designed so as to be relatively low-noise or accurate voltages, for example a well-decoupled power supply or low-noise reference voltage generator, which may provide a reference voltage independent of any power supply voltage.

The signal $S_C$ input to the TEM 103 is thus compared to the feedback signal $S_{FB}$ which is derived from the output PWM signal $S_{PWM}$. The feedback signal $S_{FB}$ corresponds to a filtered version of the output signal $S_{PWM}$ and the filter arrangement 202 provides some delay and signal averaging over time. Thus if the output PWM signal $S_{PWM}$ transitions to the high state $V_H$, the feedback signal $S_{FB}$ will be lower than the present value of the PWM signal $S_{PWM}$ and will begin to increase, i.e. become more positive, over a period of time. If the signal $S_C$ at the first comparator input is itself relatively constant over that period of time the difference between the signal $S_C$ and the feedback signal $S_{FB}$ will decrease, i.e. become less positive/more negative, until the relevant threshold is reached and the comparator output transitions to the other output state $V_L$. At this point the value of the feedback signal $S_{FB}$ will start to decrease. The hysteretic comparator 201 will maintain its output in the low state $V_L$ until the difference between the signal $S_C$ and the feedback signal $S_{FB}$ increases, i.e. becomes less negative/more positive, to the second threshold.

Thus if the signal $S_C$ applied to the first comparator input maintains a relatively constant level, the output of the hysteretic comparator 201 will continually cycle between the first and second output states $V_H$ and $V_L$. The time spent in each output state will depend on how long it takes for the feedback signal $S_{FB}$ to change by the amount defined by the hysteresis, e.g. from a value equal to $S_C$−H to a value $S_C$+H or vice versa. This will depend on the amount of hysteresis and the rate of change of the feedback signal $S_{FB}$. However, the rate of change of the feedback signal $S_{FB}$ will depend on the then-current value of the feedback signal $S_{FB}$, in particular the difference between the level of the output state and the value of the feedback signal $S_{FB}$, which in turn depends on the level of the signal $S_C$ at the first comparator input. As noted above, the action of the feedback loop of the TEM 103 illustrated in FIG. 2a means that the feedback signal $S_{FB}$ will vary between $S_C$−H and $S_C$+H, in other words the feedback signal $S_{FB}$ will essentially follow the waveform of the input signal $S_C$ with a voltage ripple of ±H.

For example, consider that, at a first transition, the comparator output transitions from the low state $V_L$ to the high state $V_H$. To transition back to the low state $V_L$ the difference between the value of the signal $S_C$ and the feedback signal $S_{FB}$ will have to decrease to the relevant threshold, defined by the amount of hysteresis, e.g. the difference must decrease to −H. If the level of the signal $S_C$ is relatively high, the value of the feedback signal $S_{FB}$ at the point of transition will also be relatively high. The difference between the level of high output state $V_H$ and the present value of the feedback signal $S_{FB}$ will thus be relatively low. Hence the value of the feedback signal $S_{FB}$ will only increase relatively slowly and it will take a relatively long time for the difference to decrease to the relevant threshold. The comparator output will thus remain in the high state $V_H$ for a relatively long duration, leading to a relatively long pulse of the high state in the PWM signal $S_{PWM}$. However if the level of signal $S_C$ is relatively low at the time of the first transition, then the value of the feedback signal $S_{FB}$ at that time would also be relatively low. There would thus be a greater difference between the level of the high output state $V_H$ and the value of the feedback signal $S_{FB}$. This will mean the feedback signal $S_{FB}$ would increase more rapidly, the difference between the feedback signal $S_{FB}$ and the signal $S_C$ would thus decrease more rapidly and the threshold would be reached more rapidly. Thus the comparator output would remain in the high state $V_H$ for a shorter duration. The opposite would apply for the subsequent duration in the low state $V_L$.

The duration of a pulse corresponding to the high state $V_H$ in the PWM signal $S_{PWM}$ (and correspondingly the duration of a pulse corresponding to the low state $V_L$ in the PWM signal $S_{PWM}$) thus depends on the level of the input to the TEM, i.e. signal $S_C$. The time encoding modulator 103 encodes the analogue input $S_C$ linearly as the duty cycle of the PWM signal $S_{PWM}$, i.e. the ratio between the duration of a pulse of a first output state, say $V_H$, to the duration of the cycle period, i.e. the total duration of the pulse of the first output state and a temporally adjacent pulse of the second output state, say $V_L$. However the overall cycle PWM cycle period, and hence frequency, i.e. the duration of both the pulse of the high state $V_H$ and the low state $V_L$ also varies non-linearly with the value of the input, and in a way such that the PWM cycle frequency varies substantially as the square of the value of the input. Embodiments of the present disclosure thus make use of this squaring function.

The TEM illustrated with respect to FIG. 2b can be implemented in a relatively very small circuit area and has relatively low power requirements in use and thus may be particularly advantageous in some embodiments. The provision of two such TEMs thus does not require significant circuit area nor impart significant power demands and thus means that multiplication can be implemented by small and low power circuitry.

Figure 3:
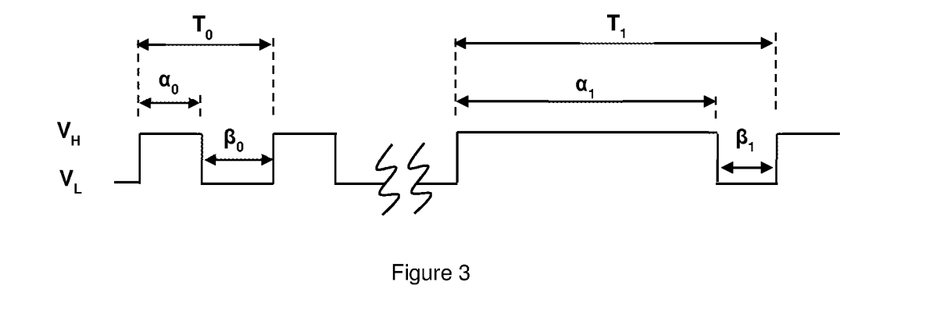
FIG. 3 illustrates the form of output signal from a time-encoding modulator.

FIG. 3 illustrates the principles of the PWM signal $S_{PWM}$ output from a time encoding modulator 103 suitable for use in embodiments of the present disclosure, e.g. such as illustrated in FIG. 2a or 2b. The PWM signal $S_{PWM}$ varies between the two output states $V_H$ and $V_L$. The duration of a pulse of the high state $V_H$ is denoted by a and the duration of a pulse of the low state $V_L$ is denoted by β. The cycle period T is equal to α+β. The cycle period T can also be seen as the period between an instance of a transition from one output state to the other output state and the next instance of the same transition.

As described above the duration a of the pulse of the high state $V_H$ depends on the level of the input to the TEM, i.e. signal $S_C$, as does the duration of the pulse of the low state $V_L$. For signals of zero magnitude (which corresponds to a signal reference voltage value equal to the midlevel voltage between $V_H$ and $V_L$, assuming a symmetric hysteresis +/−H) the periods of the pulses of each state, illustrated in FIG. 3 as $\alpha_0$ and $\beta_0$, will by symmetry be equal to one another, i.e. each equal to $T_0/2$ where $T_0$ is the PWM cycle period at zero magnitude. If the magnitude of the input $S_C$ increases, the duration of the pulse of one state will increase and the duration of the pulse of the other state will decrease to first order by:

$$\alpha=T_0/2\cdot(1-R)\beta=T_0/2\cdot(1+R) \quad \text{(Eqn. 6)}$$

where R is the level of the input signal within normalised within a range of −1 to +1, where +1 and −1 represent upper and lower limits respectively for the level of input signal that would asymptotically give zero frequency. For a TEM such as illustrated in FIG. 2b for example, which outputs voltage states $V_H$ or $V_L$ and which applies symmetric hysteresis, the normalised level of the input signal may be given by:

$$R=S_C/S_{LIM} \quad \text{(Eqn. 7)}$$

where $S_C$ represents the magnitude of the input signal (with reference to a midlevel voltage $V_{MID}=(V_H+V_L)/2$) and $S_{LIM}$ is a magnitude limit for the input to the TEM, in this example equal to $(V_H-V_L)/2$. It will be appreciated that increase in duration of one pulse is not equal to the decrease in duration of the other pulse and the overall cycle period T will change:

$$T=\alpha+\beta=T_0/(1-R^2) \quad \text{(Eqn. 8)}$$

Thus any increase in the magnitude of the input, i.e. signal $S_C$, will result in an increase in the cycle period, as illustrated in FIG. 3 by the durations $\alpha_1$ and $\beta_1$ and duration $T_1$ for a cycle period at a non-zero input signal magnitude. Thus the cycle period $T_0$ (equal to $\alpha_0+\beta_0$) corresponding to an input signal of zero magnitude will be the cycle period of shortest duration. This condition is referred to as the limit cycle and the period $T_0$ is the limit cycle period. This corresponds to the fastest cycle frequency $F_0=1/T_0$ which is referred to as the limit cycle frequency. For a TEM such as illustrated in FIG. 2b the limit cycle frequency depends on the amount of hysteresis applied, as well as the time constant of the filter, i.e. the value of resistance and capacitance.

The PWM signal $S_{OUT}$ thus encodes the level of the analogue input $S_C$ as the duty cycle of one of the pulses of output state, i.e. as $\alpha/(\alpha+\beta)$. However of interest for the present disclosure, from eqn. 6 it can be seen that the overall cycle period T depends on the square of the normalised value of input R to the TEM. The cycle period is thus inversely proportional to $1-R^2$. The PWM cycle frequency $F_{PWM}$ thus has a frequency which depends on the input to the TEM as set out in equation 1 above. Thus the difference between the frequency of the two PWM signals $S_{PWM1}$ and $S_{PWM2}$ is proportional to the difference between the squares of the values of the respective inputs.

Each TDC 104 is thus arranged to provide a digital output indicative of the frequency or period of the relevant PWM signal. Referring back to FIG. 2a, in this example each TDC 104 comprises a counter 203 which receives the relevant PWM signal, $S_{PWM}$, and also a reference clock signal CLK.

In some embodiments the counter may be configured to determine a frequency value, i.e. a value that would increase for higher frequencies and decrease for lower frequencies. In such an embodiment the TDC 104 may effectively count the number of PWM cycles within each of a successive number of count periods defined by the reference clock signal CLK. For example the counter 203 may be arranged to increment for each rising edge in the relevant PWM signal $S_{PWM}$. The counter 203 is clocked by the reference clock signal CLK so as to output the count value and reset for each period of the reference clock signal CLK. The count value output from the counter 203 is thus an indication of the number of PWM cycles within each count period.

In this case a count value C output from the counter is directly proportional to the frequency of the PWM i.e.

$$C=F_{PWM}/F_{CLK} \quad \text{(Eqn. 0)}$$

where $F_{CLK}$ is the frequency of the count period as defined by the reference clock signal.

The count value C from each count period could be output as the digital signal D, thus providing a digital output at a sample rate defined by the count period, e.g. the clock period of the reference clock signal. The same reference clock signal CLK can be supplied to be TDCs 104a and 104b to synchronise their outputs and clearly the reference clock can be used to clock the digital subtractor 105.

In some embodiments however the count values from each of a number of count periods could be summed or averaged to minimise the effect of any quantisation errors. In some embodiment, if desired, the count value could be scaled relatively easily by a desired scaling factor using a bit-shift or bit-shift and add before being output from the TDC. The resultant digital output value can be used as digital signal $D_1$ or $D_2$ as described above.

Providing a count value of the number of PWM cycles thus has the advantage of providing a value that can used directly as a frequency value without requiring any significant processing. In this instance the count period, defined by the reference clock signal, should be defined with respect to the minimum PWM cycle frequency expected in use such that there are a sufficient number of PWM cycles in each count period. The frequency of the reference clock signal may therefore be lower, and possibly significantly lower, than then the minimum expected PWM cycle frequency. This advantageously means that a relatively slow clock can be used for the TDC, which avoids the need for a fast clock and the associated power requirements.

In some embodiments the counter 203 of the TDC could, instead, be arranged to provide a count value which is indicative of the PWM cycle period of the PWM signal $S_{PWM}$. For instance in some embodiments the reference clock signal CLK could be a relatively fast clock signal with a frequency significantly greater than the PWM cycle period. In such a case, the counter 203 of the TDC 104 may be arranged to count the number of clock cycles of the reference clock signal CLK in a PWM cycle period, e.g. in a period defined between successive rising edges in the PWM signal $S_{PWM}$. For example the counter 203 may be arranged to increment for each rising edge in the reference clock signal CLK. The counter 203 is clocked by, e.g. rising edges of, the received PWM signal clock signal so as to output the count value. The count value output from the counter 203 is thus an indication of the number of reference clock cycles within the PWM cycle period.

In this case the count value C output from counter 203 is directly proportional to the PWM cycle period $T_{PWM}$ and thus is inversely proportional to the PWM cycle frequency, i.e.:

$$C = T_{PWM}/T_{CLK} = F_{CLK}/F_{PWM} \quad \text{(Eqn. 10)}$$

Thus, each count value is related to the normalized value R of the TEM input as:

$$C = (F_{CLK}/F_0) \cdot [1/(1-R^2)] \quad \text{(Eqn. 11)}$$

It is noted however that $1/(1-R^2)$ is approximately equal to $(1+R^2)$ at relatively small values of R. Thus, in some embodiments the processing circuit may be configured such that the value of the first and second combined signals $S_{C1}$ and $S_{C2}$ are constrained such that each signal has a normalised value which is relatively small, for instance no greater than a half, i.e. the processing circuit may be configured such that $R \leq 0.5$ for each combined signal so that the PWM cycle frequency reduces by less than 25%. Thus the processing circuit may be configured such the value of each of the first and second combined signals is limited to be no greater than half of a maximum input signal level for the respective first or second time-encoding modulator.

In such a case:

$$C \approx (F_{CLK}/F_0) \cdot (1+R^2) \quad \text{(Eqn. 12)}$$

In this case if the count values from the TDC 104 are used as the digital values $D_1$ and $D_2$ then, the digital output $D_{OUT}$ can be seen as:

$$D_{OUT} = \quad \text{(Eqn. 13)}$$
$$D_2 - D_1 \approx (F_{CLK}/F_0) \cdot [(1+(X-Y)^2) - (1+(X+Y)^2)] \approx$$
$$(F_{CLK}/F_0) \cdot [(X-Y)^2 - (X+Y)^2]$$

so $$D_{OUT} \approx -(F_{CLK}/F_0) \cdot (4XY) \quad \text{(Eqn. 14)}$$

Thus the difference in count values can again provide a value which is related to the product of the values it is wished to multiply, to a reasonable accuracy.

It will be understood that in such an embodiment the counter is effectively counting for a count period that is variable with the PWM cycle period, and thus each counter will have a variable sample rate. To provide synchronisation between the outputs of the two TDCs 104a and 104b, the TDCs may be arranged to re-time their outputs to some external clock and/or the TDCs may combine the count values from several successive PWM cycles in a defined frame period, e.g. to output an average count value for the frame period.

Using a fast reference clock and counting the number of cycles of the fast reference clock in periods defined by the fast reference clock means that a TDC can effectively provide a sample count value for each PWM cycle period, to a time resolution determined by the frequency of the fast clock signal. This thus allows a relatively fast effective sample rate for the output of the TDC, i.e. $D_1$ or $D_2$, but the sample rate is variable and subtracting the values from each TDC provides an approximation to the required multiplication value. By contrast, the alternative approach of counting the number of PWM cycle periods in a count period defined by a slower clock signal provides a fixed sample rate and count values that can be used to give a more exact representation of the desired multiplication value, but the update rate is much slower as the sample period more correspond to several PWM cycle periods and it may be necessary to average the results from several count periods to provide a desired level of accuracy.

In some applications the TEMs 103a and 103b may be configured to provide a PWM signal with a limit cycle frequency $f_0$ of a few megahertz, say 3 MHz in one example. If a TDC 104 is arranged to count the number of clock cycles or periods of a relatively fast clock signal in period defined by the PWM signal $S_{PWM}$, the fast clock may have a frequency of a few hundred megahertz, say 300 MHz. Alternatively were the TDC to count the number of cycles of the PWM signal in a count period defined by a slower clock signal, the clock signal may have a frequency of a few hundred kilohertz, say 300 kHz for example. One skilled in the art would be able to determine a suitable approach for a given application.

In some instances the TDCs 104a and 104b may be selectively operable to operate using either of these two approaches to provide two modes of operation. Thus each TDC 104 may be operable in a first may be operable in a first mode to count the number of cycles of the PWM signal $S_{PWM}$ in a count period defined by a clock signal CLK having a relatively slower frequency and in a second mode to count the number of cycles of a clock signal having a relatively faster frequency in periods defined by the PWM signal $S_{PWM}$. This may allow the processing circuit 100 to selectively provide two modes of operation. The second mode, using a faster clock signal, may provide a faster update rate and lower latency but may consume more power due to the faster clock. The first mode provides a slower update rate but consumes less power, so may advantageously be used in system standby or "Always-on" modes where signal multiplication may be required as part of a system to detect signal activity from a microphone or other sensor.

In any case the TDC 104 can be implemented by relatively simple, small and low power circuitry.

Thus multiplication of two values, X and Y, can be achieved efficiently in terms of power and circuit area by using two TEMs 103 with respective TDC 104.

It will of course be understood that the particular type of TEM described above is only one particular type of TEM and that other types of TEM are known. For instance a conventional asynchronous sigma delta modulator (ASDM) is a known type of self-oscillating TEM that can receive an input and output a PWM signal with a PWM frequency that depends substantially on the square of the value of the input. A conventional ASDM may receive the input and combine it with a feedback signal at the input to an integrator. The output from the integrator, which can be seen as a loop filter, is input to one comparator input of a comparator, which may be a hysteretic comparator. The output from the integrator will ramp up or down at a rate defined by the input, and also the feedback signal, and thus lead to a PWM output signal where the duty cycle depends on the level of the input to the ASDM. The PWM cycle frequency will also be a function of the square of the value of the input. In some instances, instead of applying hysteresis in comparison, a delay could instead be applied in a feedback loop for the feedback signal. Embodiments of the disclosure could therefore be implemented with any suitable type of TEM, e.g. any suitable self-oscillating TEM such as an ASDM, as the TEMs 103. Likewise whilst a low size and low power TDC can be implemented by using a simple counter, any suitable type of TDC may be implemented.

In any case, in order to provide the desired multiplication the input to the first TEM 103a is arranged to have a value corresponding to a sum of the values it is wished to multiply, i.e. X+Y, and the input to the second TEM 103 is arranged to have a value corresponding to a difference between these values, i.e. X−Y. In some instances the first and second signals $S_1$ and $S_2$ may already have the required relationship by virtue of operation of some upstream module, which may or may not be part of the same integrated circuit as the processing circuit 100. In some embodiments however the first and second signals received $S_1$ and $S_2$ may each be indicative of one of the values which it is wished to multiply, in which case there may be a signal combiner 102, as discussed in relation to FIG. 1, to generate the combined signals $S_{C1}$ and $S_{C2}$ for input to the TEMs 103.

Figure 4:
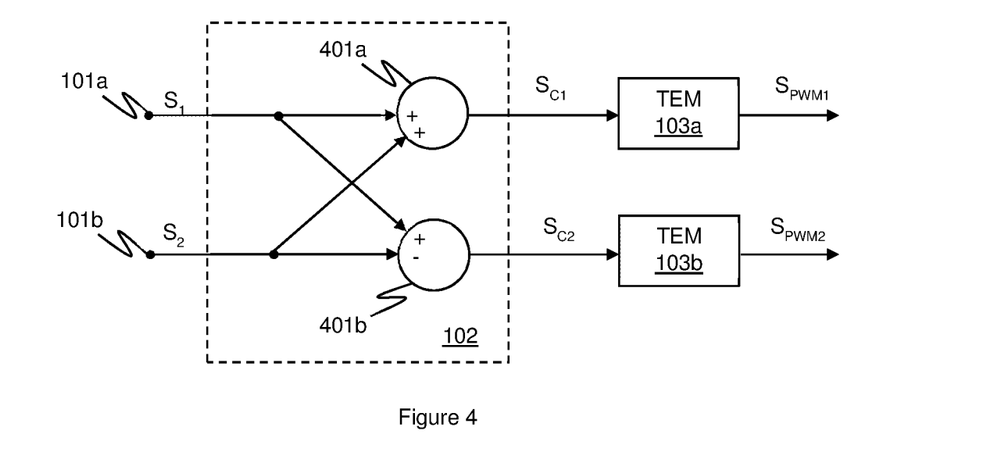
FIG. 4 illustrates in general how combined signals for the time-encoding modulators may be generated.

FIG. 4 illustrates the principle of one example of a suitable signal combiner. The combiner 102 receives the input signals $S_1$ and $S_2$ with values corresponding to X and Y respectively. A first combiner element 401a, e.g. an adder, additively combines the values of the first and second signals together and outputs the first combined signal $S_{C1}$. A second combiner element 402a, e.g. a subtractor, subtractively combines the values of the first and second signals together to provide subtraction and outputs the second combined signal $S_{C2}$. The form of the first and second combiner elements 401a and 401b may depend on the type of input signal. Analogue voltage signals could be combined in any convenient way, e.g. by being converted to corresponding current signals which can be relatively easily combined for addition or subtraction.

Figure 5:
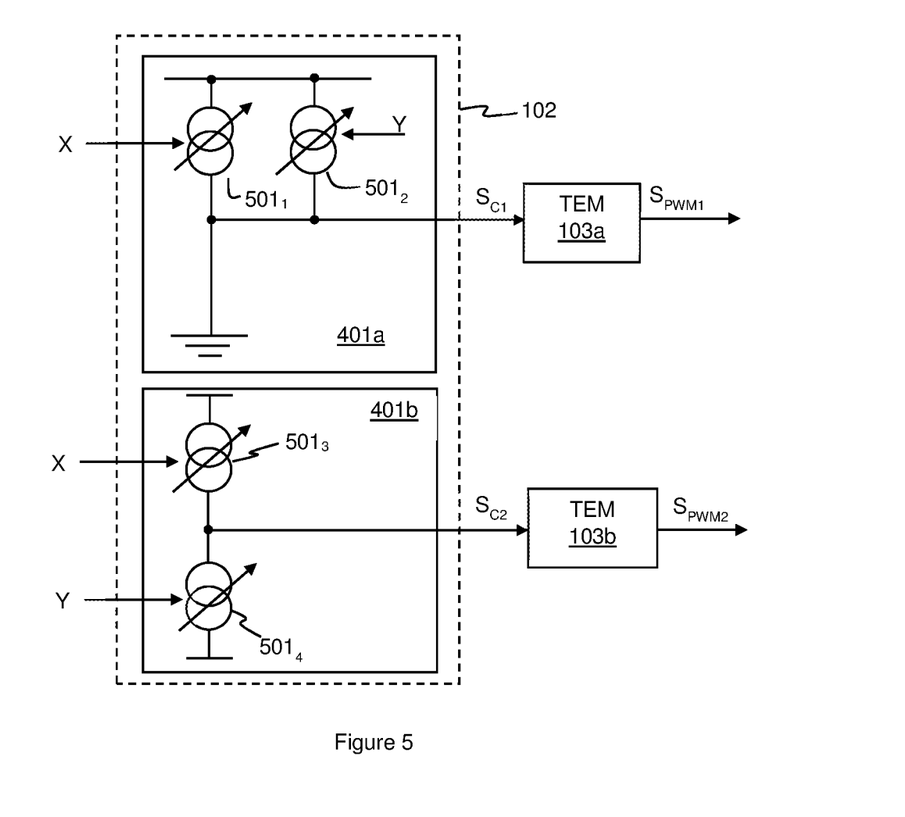
FIG. 5 illustrates one example of combining circuitry.

FIG. 5 illustrates one particular example of a signal combiner 102 in more detail. The first combiner element 401a comprises two current sources $501_1$ and $501_2$ (collectively or generically 501) which are configured to provide current to charge capacitor 502a. The current sources $501_1$ and $501_2$ are driven by a control signals derived by the first and second input signals $S_1$ and $S_2$ respectively so as to provide currents that corresponds to the values X and Y. For example the current sources could be programmable current sources or the output stage of voltage-to-current converters. In the first combiner element 401a, both current course $501_1$ and $502_2$ are arranged to additively provide current to an output node of the first combiner element 401a, i.e. both current sources provide current of the same polarity to the output node. This provide a first combined signal $S_{C1}$ with a value that corresponds to X+Y that can be supplied to the TEM 103a. Depending on the type of TEM, the current signal may be supplied directly to the TEM or could be converted to a voltage signal, e.g. by being applied to a defined impedances (not illustrated).

The second combiner element 401b also comprises two current sources $501_3$ and $501_4$ which are driven by a control signals derived by the first and second input signals $S_1$ and $S_2$ respectively so as to provide currents that corresponds to the values X and Y. In this arrangement however current source $501_3$ sources current, whereas current source $501_3$ sinks current, i.e. the current sources drive currents of opposite polarity at the output node. This arrangement provides a second combined signal $S_{C2}$ with a value that corresponds to X−Y.

It will of course be appreciated that the arrangement illustrated in FIGS. 4 and 5 are just some examples of ways in which two signals could be combined and one skilled in the art will understand there are a number of other ways they could choose to combine signals without departing from the scope of the present disclosure.

Figure 6:
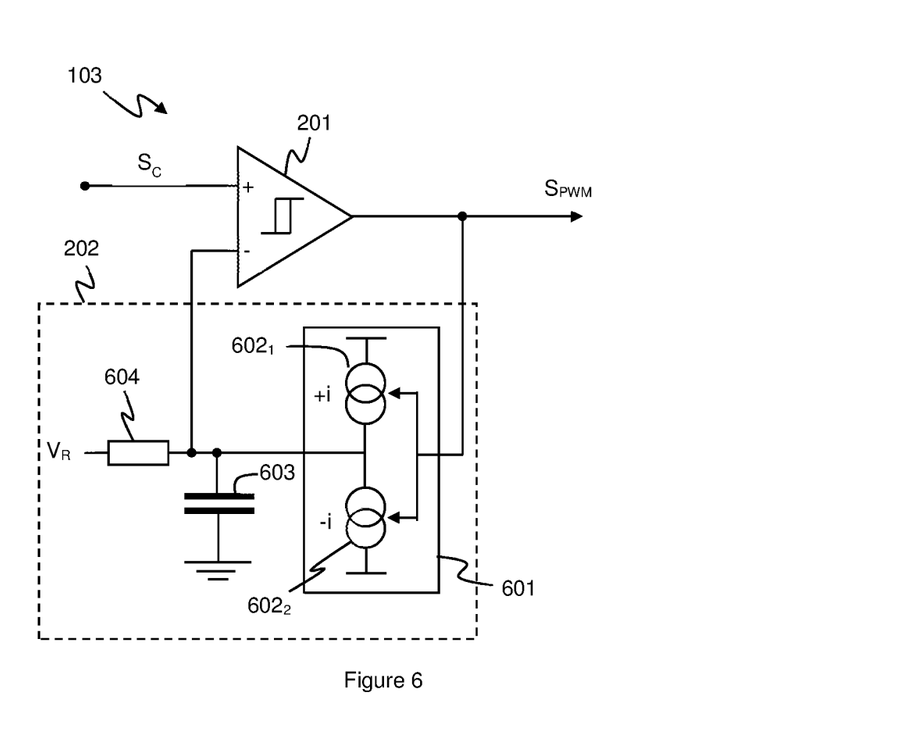
FIG. 6 illustrates another example of a time encoding modulator.

FIG. 6 illustrates an alternative arrangement for TEM 103, which is similar to that illustrated in FIG. 2b, but where the filter arrangement 202 comprises a current generator 601 configured to generate a current signal having a current that varies depending on the output state of the hysteretic comparator 201. In the example illustrated in FIG. 6 the current generator comprises a first current source $601_1$ for generating a defined positive current +i and second current source $602_2$ for generating a defined negative current −i, i.e. the second current source $602_2$ acts as a current sink. The first and second current sources $602_1$ and $602_2$ are controlled to generate a positive or a negative current depending on the output state of the comparator 201, that is the positive current +i is generated when the output signal $S_{OUT}$ is in one state and the negative current −i is generated when the output signal $S_{OUT}$ is the other state. The current signal output from the current generator 601 is supplied to a node coupled to a feedback capacitor 603, which is also biased to a reference voltage $V_R$ via impedance 604. The current signal thus charges or discharges the feedback capacitor 603 depending on its polarity. The rate of charging and discharging depends on the magnitude of the current produced by the current generator but also on the current through impedance 604, which in turn depends on the difference between the voltage of the feedback capacitor and the reference voltage $V_R$, which may conveniently correspond to the voltage of the zero magnitude input signal, e.g. the midpoint voltage. The voltage of the feedback capacitor thus provides the filtered feedback signal $S_{FB}$ for hysteretic comparator 201.

One practical advantage of the use of a current generator is that it avoids the need for voltage buffers to provide accurate voltage levels $V_H$ and $V_L$ in order for example to avoid the effects of power supply voltage variation. Such buffers need to be well designed in order to avoid transient effects as the feedback load is switched from $V_H$ to $V_L$ and vice versa to avoid, and thus may require more power and chip area than required for a simple current source whose output may be simply steered from the output node to some other node. The current source filter embodiment also provides a further advantage as total harmonic distortion is reduced due to the improved linear rise and fall of a voltage entered into the second inverting comparator input.

In a variation of the arrangement of FIG. 6, the input signal $S_C$ may be applied to the impedance 604 and the reference signal $V_R$ may be applied to the non-inverting input of comparator 201. Bearing in mind that signal $S_C$ varies slowly with respect to the PWM cycle frequency, general operation is similar, with the voltage on the node coupled to the ungrounded terminal of feedback capacitor 603 now varying around the reference voltage $V_R$ with a ripple +/−H. The reduction in the range of the common-mode input voltage of the comparator 201 may ease its design or allow a lower supply voltage.

Embodiments thus provide a processing circuit that can provide multiplication of signals. By using TEMs and TDCs a small and low power circuit can be implemented that can thus be formed as part of a functional circuit without requiring significant space. The processing circuit may multiply two analogue signals together.

Some embodiments relate to multiplying a received analogue signal by a variable as an initial stage of some processing, with further processing being applied downstream. Such further processing may be difficult or complex to implement in the analogue domain and thus may conveniently be implemented as digital processing. Such an arrangement would require an analogue-to-digital converter (ADC) at some part of the processing path, and typically the received analogue signal would be supplied to the ADC and all processing, including multiplication, applied in the digital domain. Embodiments of the present invention provide multiplication as part of the process of converting from analogue to digital and thus save on space and power compared to providing a separate ADC and digital multiplication arrangement.

Embodiments may therefore be advantageously applied for the multiplication of analogue signals. However the same principles can be applied to the multiplication of digital signals or values and in some embodiments the input signals $S_1$ and $S_2$ could be digital. For example, referring to FIG. 5, the current sources 501 could be digitally programmable current sources and thus the values X and Y could be digital values used to program the output currents. In some applications it may be beneficial to implement such a multiplication arrangement, rather than a conventional digital multiplication for size and/or power benefits.

The skilled person will thus recognise that some aspects of the above described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments of the present invention will be implemented on a DSP (Digital Signal Processor), ASIC (Application Specific Integrated Circuit) or FPGA (Field Programmable Gate Array). Thus the code may comprise conventional program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communications with one another. Where appropriate, the embodiments may also be implemented using code running on a field-(re)programmable analogue array or similar device in order to configure analogue hardware.

Some embodiments of the present invention may be arranged as part of an audio processing circuit, for instance an audio circuit which may be provided in a host device. A circuit according to an embodiment of the present invention may be implemented as an integrated circuit. One or more microphones may be connected to the integrated circuit in use.

Embodiments of the present invention may be implemented in a host device, especially a portable and/or battery powered host device. The device may be a communications device such as a mobile telephone, cellular telephone or smartphone or the like. The device may be a computing device, such as a laptop; notebook or tablet computer or a gaming device for instance. The device may be a personal media player such as an audio player or a video player, for example. The device may be wearable, such as a smartwatch and/or may be a voice controlled or voice activated device.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

The invention claimed is:

1. A processing circuit comprising:
    a first time-encoding modulator configured to receive a first combined signal corresponding to a sum of a first input signal and a second input signal and to generate a first pulse-width-modulation (PWM) signal with a cycle frequency that depends substantially on the square of the value of the first combined signal;
    a second time-encoding modulator configured to receive a second combined signal corresponding to a difference between said first input signal and said second input signal and to generate a second PWM signal with a cycle frequency that depends substantially on the square of the value of the second combined signal;
    a first time-decoding converter configured to receive the first PWM signal and to provide a first count value based on a first parameter of the first PWM signal;
    a second time-decoding converter configured to receive the second PWM signal and to provide a second count value based on a second parameter of the second PWM signal; and
    a subtractor configured to determine a difference between the first and second count values and to output an output signal based on said difference between the first and second count values;
    wherein the first time-decoding converter and the second time-decoding converter each comprise a counter configured to receive a reference clock signal and count a number of PWM cycles in each of a succession of count periods defined by the reference clock signal to provide the respective first or second count value.

2. A processing circuit according to claim 1, wherein the first parameter is a PWM cycle frequency of the first PWM signal and the second parameter is a PWM cycle frequency of the second PWM signal.

3. A processing circuit according to claim 1, wherein the first parameter is a PWM cycle period of the first PWM signal and the second parameter is a PWM cycle period of the second PWM signal.

4. A processing circuit according to claim 1 wherein the first and second time-decoding converters each comprise a respective counter configured to receive a reference clock signal and wherein the processing circuit is selectively operable in a first mode or a second mode, wherein:
    in the first mode of operation the first and second parameters are PWM cycle frequencies of the first and second PWM signals respectively, and the counters of the first and second time-decoding converters are each configured count a number of PWM cycles in each of a succession of count periods defined by the reference clock signal to provide the count value;
    in the second mode of operation the first and second parameters are PWM cycle periods of the first and second PWM signals respectively, and the counters of the first and second time-decoding converters are each configured count a number of cycles of the reference clock signal in a PWM cycle period defined by the respective one of the first or second PWM signals to provide the count value; and
    the frequency of the reference clock signal is greater in the second mode than in the first mode.

5. A processing circuit according to claim 1 further comprising a signal combiner having a first combiner element configured to additively combine the first input signal and the second input signal to generate the first combined signal and a second combiner element configured to subtractively combine the first input signal and the second input signal to generate the second combined signal.

6. A processing circuit according to claim 5 wherein:
the first combiner element comprises first and second current sources configured to provide currents defined by the first and second input signals respectively, wherein the first and second current sources are configured to supply current of the same polarity as one another to an output node of the first combiner element; and
the second combiner element comprises third and fourth current sources configured to provide currents defined by the first and second input signals respectively, wherein the third and fourth current sources are configured to supply current of the opposite polarity as one another to an output node of the second combiner element.

7. A processing circuit according to claim 1 implemented as an integrated circuit.

8. An electronic device comprising a processing circuit according to claim 1.

9. An electronic device as claimed in claim 8 wherein the device is at least one of: a battery powered device; a portable device; a communications device; a mobile telephone; a smartphone; a computing device; a laptop; notebook or tablet computer; a gaming device; a personal media player; a wearable device; a voice controlled device.

10. A processing circuit comprising:
a first time-encoding modulator configured to receive a first combined signal corresponding to a sum of a first input signal and a second input signal and to generate a first pulse-width-modulation (PWM) signal with a cycle frequency that depends substantially on the square of the value of the first combined signal;
a second time-encoding modulator configured to receive a second combined signal corresponding to a difference between said first input signal and said second input signal and to generate a second PWM signal with a cycle frequency that depends substantially on the square of the value of the second combined signal;
a first time-decoding converter configured to receive the first PWM signal and to provide a first count value based on a first parameter of the first PWM signal;
a second time-decoding converter configured to receive the second PWM signal and to provide a second count value based on a second parameter of the second PWM signal; and
a subtractor configured to determine a difference between the first and second count values and to output an output signal based on said difference between the first and second count values;
wherein the first time-decoding converter and the second time-decoding converter each comprise a counter configured to receive a reference clock signal and to count a number of cycles of the reference clock signal in a PWM cycle period defined by the respective one of the first or second PWM signals to provide the respective first or second count value.

11. A processing circuit according to claim 10 wherein the processing circuit is configured such the value of each of the first and second combined signals is limited to be no greater than a defined limit, such that a maximum variation in cycle frequency of the respective first or second PWM signals is no greater than 25%.

12. A processing circuit comprising:
a first time-encoding modulator configured to receive a first combined signal corresponding to a sum of a first input signal and a second input signal and to generate a first pulse-width-modulation (PWM) signal with a cycle frequency that depends substantially on the square of the value of the first combined signal;
a second time-encoding modulator configured to receive a second combined signal corresponding to a difference between said first input signal and said second input signal and to generate a second PWM signal with a cycle frequency that depends substantially on the square of the value of the second combined signal;
a first time-decoding converter configured to receive the first PWM signal and to provide a first count value based on a first parameter of the first PWM signal;
a second time-decoding converter configured to receive the second PWM signal and to provide a second count value based on a second parameter of the second PWM signal; and
a subtractor configured to determine a difference between the first and second count values and to output an output signal based on said difference between the first and second count values;
wherein each of the first time-encoding modulator and the second time-encoding modulator comprises:
a forward signal path configured to receive the respective first or second combined signal at a first input;
a feedback path forming a feedback loop with at least part of the forward signal path;
a comparator located in the forward signal path within the feedback loop; and
a filter arrangement within the feedback loop.

13. A processing circuit according to claim 12 wherein the comparator is a hysteretic comparator.

14. A processing circuit according to claim 12, wherein the filter arrangement comprises a resistive-capacitive filter.

15. A processing circuit according to claim 12, wherein each of the first time-encoding modulator and the second time-encoding modulator comprises:
a current generator configured to receive the respective one of the first or second PWM signals output from the comparator and to generate a first controlled current signal having a first defined current during periods of a first voltage state of the PWM signal and a second controlled current signal during periods of a second voltage state of the PWM signal; and
a capacitor configured to be charged and discharged by the first controlled current signal.

16. A multiplication circuit for multiplying a first input value by a second input value comprising:
a first signal path configured to receive a first signal with a value corresponding to the sum of the first input value and the second input value and to generate a first output value which is a function of the square of the value of the first signal;
a second signal path configured to receive a second signal with a value corresponding to the difference between the first input value and the second input value and to generate a second output value which is a function of the square of the value of the second signal; and
a subtractor for determining a difference between the first output value and the second output value;
wherein each of the first and second signal paths comprises a self-oscillating time-encoding modulator and a time-decoding converter; and
wherein the time-decoding converter in each of the first and second signal paths comprises a respective counter configured to receive a reference clock signal and wherein the multiplication circuit is selectively operable in a first mode or a second mode, wherein:
- in the first mode of operation the counter of the time-decoding converter is configured count a number of cycles in an output of the respective self-oscillating time-encoding modulator in each of a succession of count periods defined by the reference clock signal to provide a count value;
- in the second mode of operation the counter of the time-decoding converter is configured to count a number of cycles of the reference clock signal in a cycle period defined by the output of the respective self-oscillating time-encoding modulator to provide the count value; and
- the frequency of the reference clock signal is greater in the second mode than in the first mode.

17. A multiplication circuit as claimed in claim 16 comprising a signal combiner configured to receive the first and second input values and generate the first and second signals.

18. A processing circuit comprising:
- a signal combiner configured to receive first and second input signals and to generate a first combined signal corresponding to a sum of the first and second input signals and a second combined signal corresponding to a difference between the first and second input signals;
- first and second time-encoding modulators configured to receive the first and second combined signals respectively and generate respective first and second cyclic signals each with a respective cycle frequency, wherein the respective cycle frequency is substantially proportional to $(1-R^2)$ where R is a value of the respective input to the respective time-encoding modulator normalised within a range of −1 to +1 with respect to an input range of the respective time-encoding modulator; and
- first and second counters configured to receive the first and second cyclic signals respectively and produce first and second count values; and
- a subtractor configured to determine a difference between the first and second count values;
- wherein the first and second counters are each configured to generate a count value of a number of cycles of the first or the second cyclic signal in a count period defined by a reference clock signal.

* * * * *